United States Patent [19]

Haddon et al.

[11] 4,233,561

[45] Nov. 11, 1980

[54] AUTOMATIC IMPEDANCE MATCHING CONDUIT LOCATOR

[76] Inventors: Merrill K. Haddon, 13545 SW. Village Glenn, Tigard, Oreg. 97223; Clifford H. Moulton, 4175 SW. Dogwood La., Portland, Oreg. 97225

[21] Appl. No.: 967,294

[22] Filed: Dec. 7, 1978

Related U.S. Application Data

[63] Continuation of Ser. No. 814,151, Jul. 11, 1977, abandoned.

[51] Int. Cl.³ .......................... G01V 3/08; G05F 1/24; H03H 7/38
[52] U.S. Cl. .............................. 324/326; 323/43.5 S; 333/17 M
[58] Field of Search .................. 324/3, 52, 54, 67; 323/43.5 R, 43.5 S, 66; 333/17 M, 32

[56] References Cited

U.S. PATENT DOCUMENTS

| | | | |
|---|---|---|---|
| 3,066,256 | 11/1962 | Rasor | 324/54 |
| 3,237,091 | 2/1966 | Attewell | 323/43.5 S |
| 3,418,572 | 12/1968 | Humphreys | 324/67 |
| 3,530,369 | 9/1970 | Thompson | 323/43.5 S X |
| 3,706,024 | 12/1972 | Wood | 323/43.5 S |
| 3,970,918 | 7/1976 | Cooper | 323/43.5 S X |
| 4,011,499 | 3/1977 | Betsill et al. | 323/43.5 S |

*Primary Examiner*—Gerard R. Strecker
*Attorney, Agent, or Firm*—Kolisch, Hartwell & Dickinson

[57] ABSTRACT

A battery powerable electrical signaling apparatus for assisting in locating a concealed electrically conductive element, such as an underground pipe. Provided in the apparatus is circuitry which functions automatically to change the output impedance of the apparatus, when such is coupled electrically to a pipe or like element, so as to match as closely as posible, the apparatus' output impedance with that of the hidden element. Thus, the proposed circuit conserves limited energy of a battery, and extends service life.

2 Claims, 2 Drawing Figures

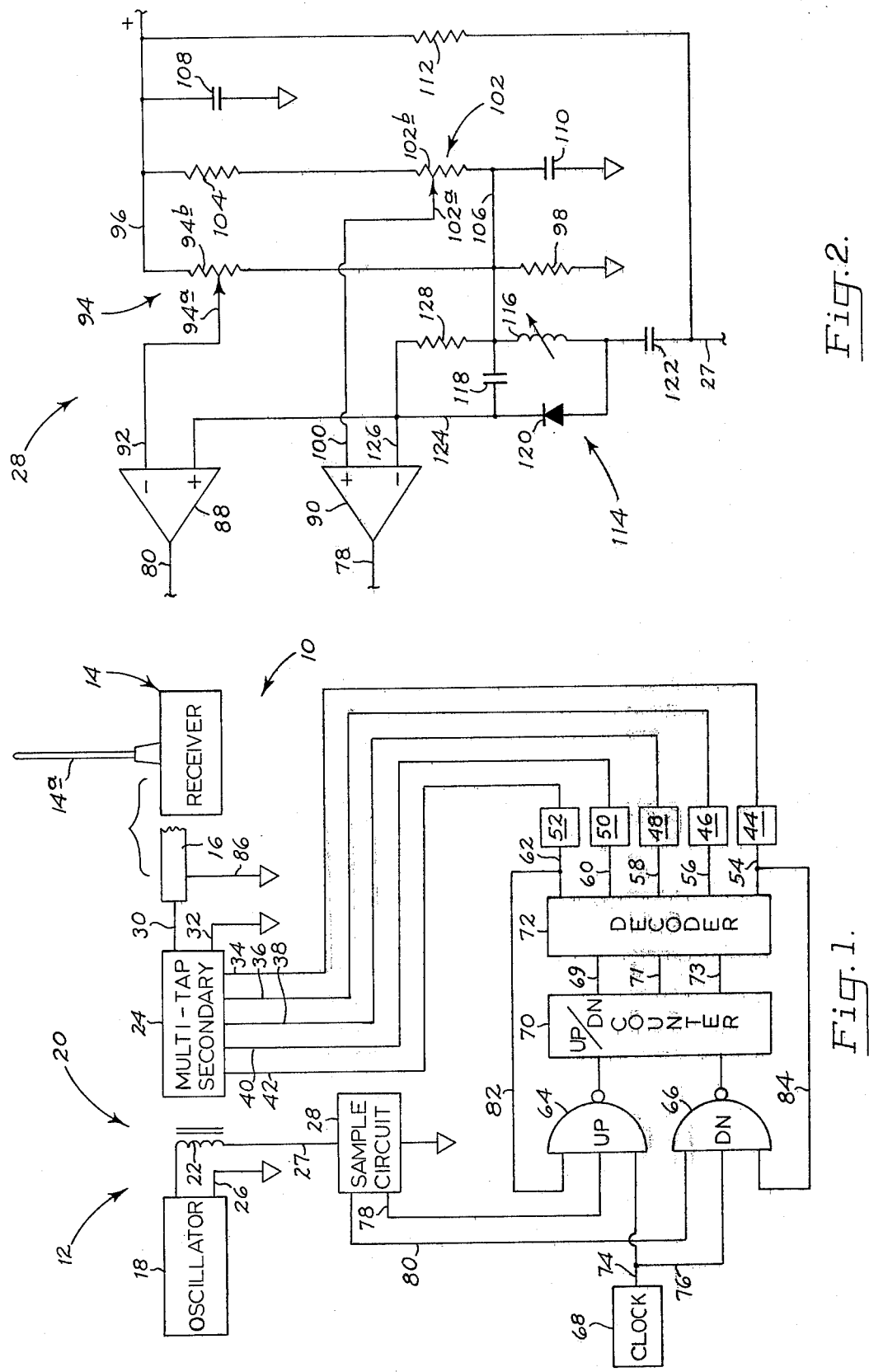

AUTOMATIC IMPEDANCE MATCHING CONDUIT LOCATOR

CROSS REFERENCE TO RELATED APPLICATION

This is a continuation of our prior-filed co-pending application entitled AUTOMATIC IMPEDANCE MATCHING CIRCUIT, Ser. No. 814,151, filed July 11, 1977, now abandoned.

BACKGROUND AND SUMMARY OF THE INVENTION

There are many applications where it is desirable and necessary to trace or locate the position of a concealed element, such as an underground cable or pipe. In cases where such a concealed element is electrically conductive, techniques have been proposed in the past for coupling an electrical signal to the element, typically at a high enough frequency so as to produce aboveground radiation. A portable receiver, tuned to the particular frequency, is then walked over the ground, and conventional triangulation techniques used to pinpoint the location and path of the element.

A problem which has been encountered in the past is that there may easily be a wide mismatch between the output impedance of the signal generator, or transmitter, employed and the impedance of the buried pipe, or cable, into which the signal is coupled. This can result in a very weak radiation signal which is difficult to monitor. To rectify this situation, proposals have been made for manually adjustable impedance-matching circuitry in a transmitter, which circuitry is adjustable by an operator to produce as close as possible an impedance match between a transmitter and a coupled pipe or cable.

However, very often operators simply do not pay adequate attention to impedance-matching procedures, and are often found to forget easily exactly what this procedure is. Further, even where, in such equipment, impedance matching has been properly performed at the beginning of a search operation, it is not uncommon to have a weather condition, or some other condition, change during the operation which radically modifies the impedance of the buried element. For example, if one starts a search operation in perfectly dry weather, one impedance match will suffice; but if, during a search operation, there should be a rainstorm which sufficiently wets the ground, a considerably different impedance match will then be required. If this occurs when the operator is some distance away from the transmitter, it will be necessary for him to return to the site of the transmitter, in order to make an appropriate adjustment, before he can continue an adequate search.

A general object of the present invention, therefore, is to provide unique means, in apparatus of the type generally described above, for greatly simplifying the problem of obtaining an impedance match of the kind indicated.

More specifically, an object of the invention is to provide such means which functions to produce automatic impedance-matching within a preselected range of potential impedances, thus eliminating a major source of operator error.

Still another object of the invention is to provide such means which accomplishes the stated function through monitoring the level of output current from a transmitter in the apparatus, and which automatically seeks to maximize this current.

Various other objects and advantages that are attained by the invention will become more fully apparent as the description which now follows is read in conjunction with the accompanying drawings.

DESCRIPTION OF THE DRAWINGS

FIG. 1 is a block schematic diagram illustrating locating apparatus constructed in accordance with the present invention.

FIG. 2 is a circuit diagram of a current-sampling circuit employed in the apparatus of FIG. 1.

DETAILED DESCRIPTION OF THE INVENTION

1. Explanation of Terminology

Explaining briefly certain terminology which is used herein, various components shown in the drawings operate in response to a pair of voltage levels. More specifically, one of these levels corresponds to a certain positive voltage which will be referred to hereinafter as a "1" state. The other level corresponds essentially to ground, and will be called hereinafter a "0" state. A terminal or a conductor having one of these voltage levels on it will be referred to as being in, or as having on it, either a "1" or a "0" state.

2. Descriptions of Gates and Operational Amplifiers Used

Among the components illustrated in the drawings which respond to and produce the two voltage levels just mentioned are certain logic gates and operational amplifiers. More specifically, two three-input NAND gates are used, as are two operational amplifiers.

In a NAND gate: with a "0" state on any input, the output is held in the "1" state; with all inputs in "1" states, the output is placed in a "0" state.

An operational amplifier includes a pair of inputs and a single output. One input is referred to as a noninverting input (indicated in the drawings with a + sign next to the input, and the other input is referred to as an inverting input (indicated in the drawings with a − sign next to this input).

With a positive reference voltage of a certain level applied to the inverting input of such an amplifier, the output of the amplifier remains in a "0" state until such time as the level of voltage applied to the noninverting input exceeds that of the reference voltage. When this occurs, the output of the amplifier changes from "0" to "1". With a positive reference voltage so applied to the noninverting input of an operational amplifier, the output of the amplifier remains in a "0" state until the level of voltage applied to the inverting input drops below that of the reference voltage, whereupon the output switches from a "0" state to a "1" state.

3. The Apparatus Generally

Turning now to the drawings, and referring first to FIG. 1, indicated generally at 10 is apparatus incorporating the present invention for assisting in locating a concealed conductive element, such as an underground cable or pipe. The apparatus includes a transmitter 12 and a receiver 14, and in the specific apparatus being illustrated, these two devices operate at a frequency of about one-hundred-seventeen kilohertz. For the purpose of illustration, apparatus 10 is shown in FIG. 1 as being used in conjunction with locating the depth and distance of an elongated underground pipe, one end of which appears schematically at 16 in the figure.

Included within transmitter 12 are an oscillator 18, or signal generator, powered by a conventional power circuit (concealed), and an output transformer 20 including a primary winding 22 and a multi-tapped secondary winding, shown (for the sake of simplification) in block form at 24. Oscillator 18 and transformer 20 are referred to herein as electrical signal-producing means.

One output of oscillator 18 is connected as shown to the upper end of winding 22 in the figure, and the other output is connected through a conductor 26 to ground. Oscillator 18 operates herein at the frequency above mentioned, and at a suitable power level, such as about 0.1–1.0 watt. A signal current produced by the oscillator flows in winding 22, and through this winding to ground through a current-sampling circuit, or current-monitoring means, constructed in accordance with the invention and illustrated in simple block form at 28 in FIG. 1. The operation of circuit 28 will be discussed shortly.

Energy from winding 22 is coupled in a well known fashion through the magnetic core of transformer 20 into secondary winding 24, the opposite ends of which form output terminals for transmitter 12, which terminals herein take the form of conductors 30, 32. Winding 24 is provided with five different tapped sections, tapping of which is under the control of voltage state changes that occur on control conductors 34, 36, 38, 40, 42.

More specifically, included within block 24, which includes the transformer secondary winding, are switches, such as relay-type switches, with such a switch provided for each of the five control conductors just mentioned. Grounding of one of conductors 34–42, inclusive, produces actuation of its associated switch to place different numbers of the sections of secondary 24 in series-circuit between conductors 30, 32. In particular, grounding of conductor 34 places one of the sections alone connected between conductors 30, 32. Grounding of conductor 36 places two sections in series between conductors 30, 32. Similarly, grounding of conductors 38, 40, 42, respectively, places three, four and five of the sections, respectively, in series between conductors 30, 32. Obviously, the greater the number of such sections connected in series between output conductors 30, 32, the greater is the output impedance of transmitter 12.

Grounding of conductors 34, 36, 38, 40, 42 is under the control of suitable electronic switching devices indicated at 44, 46, 48, 50, 52, respectively. These switching devices have their inputs connected as shown to conductors 54, 56, 58, 60, 62, on each of which conductors a "0" state condition causes actuation of the associated switching device to cause grounding of, or the placing of the "0" state on, the conductor leading from the device to block 24.

Cooperating with sampling circuit 28 according to the invention are two three-input NAND gates 64, 66, a clock pulse generator 68, an up/down counter 70, and a binary decoder 72. All of these devices are conventional in construction, and hence are shown only in block form. Coupling and feedback conductors 69, 71, 73 interconnect counter 70 and decoder 72. The output of gate 64 is connected to the "up count" input of counter 70, and the output of gate 66 to the "down count" input. Decoder 72 has five outputs connected to previously mentioned conductors 54–62, inclusive.

Counter 70, decoder 72, and switching devices 44–52, inclusive, comprise changeable-condition impedance adjusting means herein. Gates 64, 66 along with clock pulse generator 68 comprise interconnecting means.

Generator 68 produces on conductor 74 regularly recurring positive-going spikes (i.e. voltage state changes from "0" to "1", and back to "0") at the rate of about ten pulses-per-second. Conductor 74 is connected to the lower input of gate 64 in FIG. 1, and through a conductor 76 to the intermediate or middle input of gate 66 in the figure. Sampling circuit 28 includes a pair of output terminals, one of which is connected through a conductor 78 to the middle input of gate 64 in FIG. 1, and the other of which is connected through a conductor 80 to the upper input of gate 66 in the figure.

A conductor 82 connects the upper input of gate 64 in FIG. 1 to previously mentioned conductor 62. A conductor 84 connects the lower input of gate 66 in FIG. 1 to previously mentioned conductor 54.

Completing a description of what is shown generally in FIG. 1, apparatus 10 is illustrated in a condition usable for tracing pipe 16. More specifically, conductor 30 is connected conductively (in any suitable fashion) to an exposed end portion of the pipe. Conductor 32 is conductively connected to earth ground, also by any suitable means, as by a metallic spike which is driven into the ground, or a metallic plate resting on the ground. It will be noted that a ground connection is indicated at 86 for pipe 16—this connection resulting from the fact that the pipe is physically buried within the ground. It is contemplated that transmitter 12 will be housed within a relatively small portable unit connectable both to a pipe, or the like, and to ground, as just described, at any suitable location along the pipe. Receiver 14 is also preferably a small portable receiver which may be carried, as will be explained, by an operator during a search operation. Receiver 14 includes the usual antenna 14a which functions to pick up signals radiated through the ground from pipe 16. Suitable conventional means is provided in the receiver for using well-known triangulation techniques for locating the depth of pipe 16, as well as for tracing its path in the ground.

FIG. 2 of the drawings illustrates the construction of sampling circuit 28. Included within this circuit are two operational amplifiers 88, 90. A positive reference voltage is applied to the inverting input of amplifier 88 through a conductor 92 which is connected to the wiper 94a of a variable resistor 94. The resistive element 94b of resistor 94 has its upper end in FIG. 2 connected to a positive voltage supply conductor 96, and its lower end in the figure connected through a fixed resistor 98 to ground. A suitable source of positive voltage (not shown) is connected to conductor 96. Similarly, a positive reference voltage is applied to the noninverting input of amplifier 90, through a conductor 100 which is connected to the wiper 102a of a variable resistor 102. The upper end of the resistive element, 102b, in resistor 102 connects through a fixed resistor 104 with conductor 96, and the lower end of this element connects through a conductor 106 with the upper end of resistor 98 in FIG. 2.

Two high-frequency bypass capacitors 108, 110 are provided, the former bypassing conductor 96 to ground, and the latter bypassing conductor 106 to ground.

Current flowing in the primary of previously mentioned transformer 20 (see FIG. 1) is sampled by a sampling resistor 112 which is connected between conductors 27, 96 as shown. Sampled current develops an AC voltage across this resistor which is applied through a filter circuit 114 to amplifiers 88, 90. More specifically, filter circuit 114, or filter circuit means, includes a variable inductor 116, a capacitor 118, and a diode 120 interconnected as shown. A capacitor 122 couples conductor 27 to the junction between inductor 116 and diode 120. Previously mentioned conductor 106 is connected to the junction between inductor 116 and capacitor 118. A conductor 124 connects the junction between diode 120 and capacitor 118 with the noninverting input of amplifier 88, and this conductor, along with a conductor 126, connects such junction to the inverting input of amplifier 90. A resistor 128 is connected in parallel as shown across capacitor 118. Inductor 116 is tuned with capacitor 122 so that this circuit passes, and allows rectification by diode 120, of essentially only the fundamental frequency of oscillator 18, namely, one-hundred-seventeen kilohertz.

It will thus be apparent that when AC current at the frequency just mentioned flows in the primary of transformer 20, this current develops an AC voltage of a certain level across resistor 112, which voltage is directly proportional to the level of the flowing current. Filter circuit 114 filters this voltage to allow to pass only that which occurs at the fundamental frequency of oscillator 18, and feeds this signal to be rectified by diode 120, whereupon a DC voltage is produced on conductors 124, 126 which is also directly proportional to the level of flowing current. This voltage is applied, as can be seen, to the noninverting input of amplifer 88, and to the inverting input of amplifer 90. There is thus applied to these two amplifier inputs a voltage level which shifts up and down with the level of current flowing in primary winding 22. By virtue of the orientation of diode 120, the voltage so applied to the amplifiers is positive.

Through experimentation, and by way of techniques well known to those skilled in the art, a range of current levels has been selected which, when flowing within primary 22, is indicative that a relatively close impedance match exists between the output of transmitter 12 and whatever the transmitter is coupled to, such as pipe 16. Further, resistor 112 has been chosen to produce a selected range of voltages directly related to this selected range of currents which is suitable for operation with amplifiers 88, 90. The range of currents which have been selected herein is such that the range of voltages produced through sampling by resistor 112 is between about 3.8-volts and about 5-volts in amplitude.

Wiper 94 is adjusted to place a reference voltage on the inverting input of amplifier 88 of about +5-volts. Wiper 102 has been adjusted to place a reference voltage on the noninverting input of amplifier 90 of about +3.8-volts. Thus, and recalling the earlier discussion with respect to the performance of operational amplifiers, such as amplifiers 88, 90, it will be evident that so long as the voltage existing on conductors 124, 126 is within the range of about +3.8 to about +5.0-volts, the outputs of the amplifiers, and hence the voltages states of conductors 78, 80, are "0".

Whenever the voltage on conductors 124, 126 drops below about 3.8-volts, which condition will result from a lowering of current in primary 22 below the selected range mentioned, the voltage state on the output of amplifier 90 switches to "1". Such a condition occurs when transmitter 12 is coupled into too high an impedance, and it is necessary to increase the output impedance of the circuit to increase the current flow. Hence, and as will be more fully explained, a voltage state change from "0" to "1" on the output of amplifier 90, and hence on conductor 78, is an indication that the apparatus of the invention should increase the output impedance of transmitter 12. Similarly, whenever the voltage on conductors 124, 126 rises above about 5.0-volts, which occurs whenever the current in primary 22 rises above the level of the selected current range, the voltage state on the output of amplifier 88 switches from "0" to "1", which state change also occurs on conductor 80. This situation is an indication that the apparatus is improperly matched to too low an impedance, and acts as a signal that the apparatus should adjust the impedance downwardly to improve the coupling situation.

Considering now how transmitter 12 in apparatus 10 performs, with the transmitter operating, an initial condition will exist with all but one of the outputs of decoder 72 having a "1" state on it. The fifth output will be in a "0" state. As will become apparent, this condition results from the presence of voltage states on conductors 69, 71, 73 indicating a particular count in counter 70. Counter 70 is intended to count up and down throughout a range of five counts, and let us assume initially, that the counter is in its low-count condition. With this the situation, conductor 54 connected to the lowermost output of decoder 72, will be in a "0" state, and conductors 56, 58, 60, 62 will all be in a "1" state. Consequently, conductor 34 will be in a "0" state, and conductors 36, 38, 40 42, in "1" states.

From the discussion above regarding apparatus within block 24, it will thus be apparent that one of the five sections in the secondary of transformer 20 is coupled to primary 22. It will also be apparent that conductor 82 applies a "1" state to the upper input of gate 64, and that conductor 84 applies a "0" state to the lower input of gate 66. Considering the latter-mentioned situation, this "0" state on the lower input of gate 66 holds the output of the gate in a "1" state.

Let us assume further, now, that the output terminals of the transmitter—conductors 30, 32—are connected as shown in FIG. 1. The range of output impedances which is possible for the transmitter, through including more or less of the sections of the secondary of transformer 20, has been selected, substantially, to encompass all normally expected input impedances of elements, such as pipe 16. Hence, it is assumed, that under all normal operating conditions, the required output impedance of the transmitter, to maximize signal input to a pipe or the like, will fall within this range of impedances. With initial conditions in the transmitter as described, i.e. with but a single section of the secondary of transformer 20 coupled primary 22, the transmitter is in a condition operating with its lowest output impedance. If the situation exists that the input impedance of pipe 16 falls low enough in the range of possible output impedances of the transmitter to produce a current in resistor 112, that generates a voltage thereacross of between about +3.8 and about +5 volts, the outputs of amplifiers 78, 80 remain in "0" states, and no change occurs in the transmitter. This is the situation which exists where it is considered that the output impedance of the transmitter substantially matches the input impedance of the pipe.

However, if the pipe presents a too-high input impedance, then, the current sampled by resister 112 is too low to generate thereacross a voltage exceeding about 3.8 volts, and the output of amplifier 90 switches to a "1" state which is applied through conductor 78 to the middle input of gate 64. A condition then exists with the upper two inputs of gate 64 held in "1" states, whereupon pulses from generator 68 are transmittable through the gate to cause counting up (with each pulse) in counter 70. With each upcount produced in the counter, the voltage state conditions on conductors 69, 71, 73 change relative to one another, with successive counts causing successive "0" states to occur on conductors 56, 58, 60, 62 in order, respectively. In other words, the first upcount to be received and counted by the counter causes decoder 72 to place a "0" state on conductor 56, to return a "1" state to conductor 54, and to hold conductors 58, 60, 62 in one states. Similarly, the second count so received causes a "0" state to be placed in a similar fashion on conductor 58.

With a "0" state condition applied to conductor 56, it will be seen that switching occurs which now places two of the sections of the secondary of transformer 20 in a condition coupling with primary 22. Consequently, the output impedance of the transmitter is increased. If this increase is sufficient to cause the voltage sampled across resistor 112 to be between about +3.8 volts and about +5 volts, the output of amplifier 90 is returned to a "0" state, whereupon the output of gate 64 is returned to a "0" state, and no further counting occurs in the counter. If this, in fact, is the case, what this means is that the addition of one more section in the secondary of transformer 20 has been sufficient substantially to match the input impedance of pipe 16. If the voltage sampled is still below +3.8 volts, another pulse is counted, and another section of the secondary is added. This operation continues until a sufficient number of sections are added to match the pipe's input impedance. When it becomes necessary that all five sections are added, a "0" state exists on conductor 62, and this "0" state is applied through conductor 82 to the upper input of gate 64, locking the output of this gate in a "1" state. Under such circumstances, no further upcounting is possible.

Under circumstances where the output impedance of the transmitter is too high for a connected pipe or the like, the output of operational amplifier 88 is placed in a "1" state, which state is applied through conductor 80 to the upper input of gate 66. This situation then enables pulses from generator 68 to pass through gate 66 to cause downcounting in counter 70. When downcounting occurs, successive sections of the secondary of transformer 20 are removed, much in the same manner as they were added, as just described. When the output impedance of the transmitter has been reduced sufficiently to produce an adequate match to the input impedance of a pipe, etc., a voltage condition exists across sampling resister 112 which causes the outputs of both amplifiers 88, 90 to be in "0" states.

It is thus apparent that the apparatus of the invention functions automatically to produce a substantial impedance match between the output impedance of a transmitter of the type described and a coupled pipe or the like. Operator intervention is not necessary to effect this match. Thus, the advantages mentioned earlier are clearly offered by the invention, and the drawbacks discussed are avoided.

While a preferred embodiment of the invention has been described herein, it should be apparent to those skilled in the art that variations and modifications are possible without departing from the spirit of the invention.

It is claimed and desired to secure by Letters Patent:

1. In apparatus for coupling an electrical search signal to a concealed electrically conductive element for the purpose of assisting in locating the same a pair of output terminals operatively connectable to such an element, electrical signal-producing means including transformer means having primary and secondary sides, with said primary side being operatively connected to a signal generator and with said secondary side being operatively connected to said terminals for supplying a search signal thereto, current-monitoring means operatively connected to said primary side for monitoring the level of primary-side current, said current monitoring means including filter circuit means constructed to allow such monitoring only of currents having a frequency substantially the same as the fundamental frequency of said signal generator, changeable-condition impedance-adjusting means operatively connected to said secondary side, changeable to adjust, to different selected amounts within a preselected range, the output impedance of said secondary side as coupled to said terminals, said impedance-adjusting means including, for defining said range and said selected impedance amounts, a digital bidirectionally gatable up/down counter which is gated in response to selected changes in the level of primary-side current monitored by said current-monitoring means, with different counts stored in said counter effecting different output impedance amounts within said range, and means operatively interconnecting said current-monitoring means and said counter, whereby the level of monitored primary-side current is effective to change the count stored within said counter so as to produce an output impedance amount within said preselected range which accommodates maximum output-current flow from said secondary side through said terminals.

2. The apparatus of claim 1, wherein said secondary side comprises a multi-tapped secondary winding, said current-monitoring means comprises a resistor operatively connected to said primary side for carrying at least a portion of the current flowing through such side, and said counter has an output operatively connected to the taps in said secondary winding.

* * * * *